(12) United States Patent
Hoad et al.

(10) Patent No.: US 10,101,376 B2
(45) Date of Patent: Oct. 16, 2018

(54) SYSTEM AND PROCESS

(71) Applicant: QINETIQ LIMITED, Farnborough (GB)

(72) Inventors: Richard Hoad, Farnborough (GB); David Louis Herke, Farnborough (GB)

(73) Assignee: QINETIQ LIMITED, Hampshire (GB)

( * ) Notice: Subject to any disclaimer, the term of this patent is extended or adjusted under 35 U.S.C. 154(b) by 0 days.

(21) Appl. No.: 15/410,245

(22) Filed: Jan. 19, 2017

(65) Prior Publication Data
US 2017/0212161 A1    Jul. 27, 2017

(30) Foreign Application Priority Data

Jan. 21, 2016    (GB) .................................. 1601134.8

(51) Int. Cl.
G08B 21/00     (2006.01)
G01R 31/00     (2006.01)
G01R 29/08     (2006.01)
H04B 17/10     (2015.01)
G01R 19/165    (2006.01)
(Continued)

(52) U.S. Cl.
CPC ..... *G01R 31/001* (2013.01); *G01R 19/16528* (2013.01); *G01R 29/0814* (2013.01); *G01R 29/0892* (2013.01); *H01Q 1/36* (2013.01); *H01Q 1/38* (2013.01); *H01Q 1/526* (2013.01); *H04B 17/103* (2015.01); *G01R 29/0878* (2013.01)

(58) Field of Classification Search
CPC .... G01R 31/001; G01R 29/0814; H01Q 1/38; H01Q 1/36; H01Q 1/526

USPC .................................................. 340/662, 660
See application file for complete search history.

(56) References Cited

U.S. PATENT DOCUMENTS 5,697,958 A    12/1997 Paul et al.
5,977,762 A    11/1999 Murtha, Jr. et al.
(Continued)

FOREIGN PATENT DOCUMENTS

EP    0713714 A2    5/1996
EP    2 237 055 A1    10/2010
(Continued)

OTHER PUBLICATIONS

International Search Report for GB1601134.8 dated Jul. 26, 2016 (in English).
(Continued)

*Primary Examiner* — Toan N Pham
(74) *Attorney, Agent, or Firm* — Kenealy Vaidya LLP

(57) ABSTRACT

Some embodiments are directed to an electromagnetic interference (EMI) indicator includes an ultra-wideband detector, preferably having a bandwidth of at least 30 MHz to 6 GHz. At least one antenna is provided for receiving EMI. Each antenna has receiver protection, a logarithmic receiver to convert the EMI signal into a direct voltage proportional to the magnitude of the EMI signal, a peak/average detector, and a controller connected to the output of the receiver for generating a signal when the direct voltage developed in the detector exceeds a pre-set threshold voltage using, for example, a carefully defined algorithm. The peak/average detector and controller are connectable to an indicator, which is activatable by the controller, which stores EMI event data in a non-volatile memory store.

22 Claims, 3 Drawing Sheets

1. Remote Detector Unit (RDU) provide visual indications of 'EMI events' and 'system status'
2. Two way wireless communication between Central Terminal and 'n' RDU's, provide RDU programming uplink or 'EMI event' or 'system status' downlink from RDU's Note: wireless communication modes include (GPRS and ZigBee). A wired (USB) link can be also provided for engineering purposes

(51) Int. Cl.
*H01Q 1/36* (2006.01)
*H01Q 1/38* (2006.01)
*H01Q 1/52* (2006.01)

(56) References Cited

U.S. PATENT DOCUMENTS

| | | | | |
|---|---|---|---|---|
| 6,154,178 | A * | 11/2000 | Aslan | G01R 29/0857 340/600 |
| 7,933,727 | B2 * | 4/2011 | Taulu | G01R 33/025 600/409 |
| 8,600,480 | B2 * | 12/2013 | Kariv | G01R 33/007 600/424 |
| 9,000,376 | B2 * | 4/2015 | Hwang | G01J 5/28 250/341.1 |
| 9,366,576 | B2 * | 6/2016 | Hwang | G01J 5/28 |
| 2007/0298724 | A1 | 12/2007 | Sulkowski, Jr. et al. | |
| 2009/0207036 | A1 | 8/2009 | Ko et al. | |
| 2011/0092181 | A1 | 4/2011 | Jackson et al. | |
| 2012/0326933 | A1 | 12/2012 | Leferink et al. | |

FOREIGN PATENT DOCUMENTS

| | | |
|---|---|---|
| WO | 9641203 A1 | 12/1996 |
| WO | 03083495 A1 | 10/2003 |
| WO | 2011047377 A2 | 4/2011 |

OTHER PUBLICATIONS

International Search Report and Written Opinion of the International Searching Authority dated Mar. 31, 2017 in International Application No. PCT/EP2017/051033 (in English).

* cited by examiner

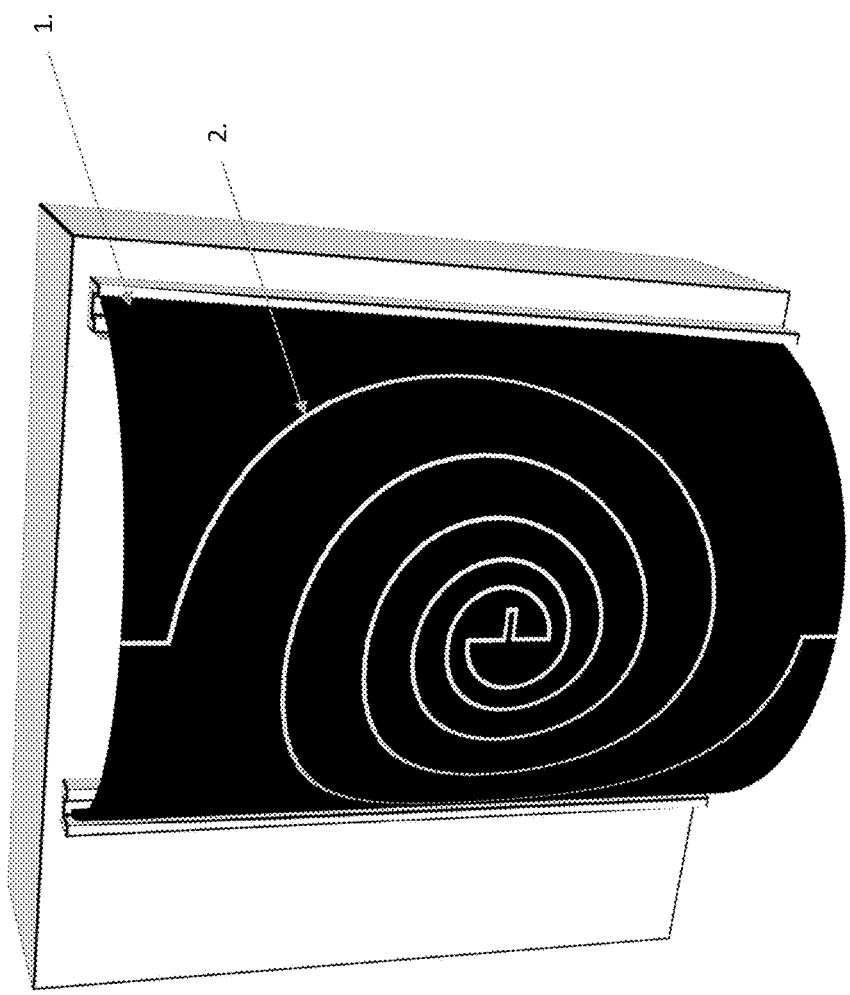
Figure 3 – inverted Log spiral antenna curved in azimuth
Dark colour – conductive surface
Light colour – dielectric surface

SYSTEM AND PROCESS

CROSS REFERENCE TO RELATED APPLICATION

This application claims benefit of British Patent Application GB1601134.8 filed Jan. 21, 2016, the entire content of which is incorporated herein by reference.

BACKGROUND

Some embodiments relate to a system and process for detecting radiated electromagnetic interference (EMI) and for indicating when the strength of the EMI exceeds a predetermined level.

Electrical/electronic equipment can be susceptible to EMI. Intense electromagnetic fields and pulses can induce electrical currents and voltages in electrical/electronic equipment, causing the equipment to malfunction or to become permanently damaged. Business practices which rely heavily on electrical/electronic equipment such as Information Communications Technology (ICT), e.g. financial institutions (banks, stock markets), aviation (aircraft and air traffic control), security equipment, and utilities (telephone exchanges, power grid controllers) are particularly at risk. The electromagnetic disturbance causing the equipment upset or damage is often termed as electromagnetic interference or EMI. This is not to be confused with the more common usage of the term "interference", which implies disturbances to radio signals that may cause degradation in performance of radio receivers. In this text, the term EMI refers to Electromagnetic signals which cause a departure in normal operating function of electrical/electronic equipment.

SUMMARY

Electromagnetic interference sources may be classed as intentional or unintentional. Intentional EMI is the deliberate generation of EM energy aimed at causing disruption, upset or malfunction to electrical/electronic equipment. Unintentional EMI can occur naturally or accidentally, but the effects on electrical/electronic equipment can be similar. Examples of potential sources of unintentional EMI are the natural EM phenomena of lightning and electro-static discharge (ESD) or man-made sources such as Radio Frequency (RF) transmitters.

Either type of EMI, intentional or unintentional, can be further described as narrowband or broadband. Broadband, sometimes referred to as ultra-wide band, interference is normally generated by very short pulses, typically of a few hundred picoseconds to a few nanoseconds duration. These pulses have a wide bandwidth, typically 25-100% of the centre frequency, and the frequency range of broadband interference can instantaneously cover hundreds of MHz to a few GHz. Narrowband interference, has a nominal bandwidth of 1% of the centre frequency. Narrowband interference generally has much higher average power content, whereas broadband signals tend to have high instantaneous peak power content.

Electrical and electronic equipment is also susceptible to single EM events, for example, from an Electromagnetic Pulse (EMP) generated by a nuclear electromagnetic pulse (NEMP) device or lightning (LEMP). EMP radiation is usually characterized as having both lower frequency content and wider bandwidth than conventional continuous interferers, typically 10 kHz to 150 MHz, symptomatic of a longer pulse width, typically a few hundred nanoseconds, but is generally of much higher energy. All of the interferers described above are considered to pose a threat to electrical/electronic equipment found, for example, in most business practices.

The extensive use and ever-increasing dependence by society on electrical/electronic equipment for data processing or communications makes their susceptibility to EMI of particular concern. Traditional countermeasures for protecting electrical/electronic equipment involve enclosing the equipment within an electrically conductive shield and using filtering on cable connections. Whilst shielding and filtering can provide an effective guard against EMI, the use of shielding and filtering on every piece of electrical/electronic equipment owned by a particular business can prove prohibitively expensive, particularly as most commercial available electrical equipment is not provided with the required degree of protection. Shielding can also add considerable weight to the system, which clearly hinders portability. Housing the equipment and any cables within a fully enclosed electrically conductive room offers an alternative solution. However, not all electrical equipment owned by a particular business can be conveniently protected in this manner. Consequently, such room sized enclosures are generally used only to protect critical equipment. Enclosures of this type are clearly unsuitable for protecting portable electrical/electronic equipment.

As shielding every piece of electrical/electronic equipment and cabling can prove expensive and inconvenient, an alternative approach is simply to provide an indicator of disruptive levels of EMI and therefore to allow a user to take their own evasive action, e.g. moving the electrical equipment further from the EMI source, erecting a shield, powering down the equipment. There may be situations in which the user is not concerned with protecting the electrical equipment, but instead wishes only to know when they are experiencing EMI so that measures can be taken. An electromagnetic disturbance to electronics can be extremely difficult to discern, particularly as most electrical equipment crashes or similar disruptions are often attributed to a software or hardware fault. It is therefore desirable to have a device which will provide an indication when EMI capable of disrupting electrical/electronic equipment is detected.

RELATED ART

Devices for sounding an alarm upon detecting EMI, e.g., RF leak detectors and Electromagnetic Field personal monitors, are generally designed to detect emissions from consumer electronics, such as microwave ovens, and do not cover the range of frequencies or pulse characteristics necessary for detecting ultra-wide bandwidth, short pulse narrowband, or single event EMI.

WO 03/083495 (QinetiQ) describes an EMI indicator for detecting electromagnetic radiation. This device includes a loop antenna detector for receiving EM radiation having a bandwidth of at least 10 MHz to 7 GHz and LED, and a buzzer for generating a warning when strength of EM radiation approaches levels capable of disrupting a personal computer.

It may be beneficial to provide EMI detector devices and systems with enhanced capabilities and/or efficiencies for detecting and differentiating types of EMI, especially pulsed (wideband) EMI, whether intentional or unintentional, and for indicating when the strength of such EMI exceeds predetermined threshold levels. It may also be beneficial to provide such devices, systems and processes. In particular, it provides a low cost device suitable for detecting and monitoring EMI, with characteristics that have the potential for and whose intensity approaches a level required for disrupting the operation of typical electrical/electronic equipment.

Some embodiments can include a number of detector devices that can communicate to a central computer terminal over a wired or wireless link. In particular, the detector device can be capable of detecting EMI, having frequencies, energies and other signal parameters liable to interfere with the function of electrical/electronic equipment. The EMI detection system may offer a low cost solution with low running costs.

Some embodiments are directed to methods and apparatus for detecting EMI and indicating that EMI poses a threat to electrical/electronic equipment. Systems and indicators can include a single detector or many detectors which can be communicated with and controlled by a central terminal using wired or wireless transmission.

The controller may take any suitable form, for example may be a processor, for example a Central Processing Unit (CPU) or plural processors.

Detectors can also allow a wide range of location settings, power source options and settings optimizations. Computer systems can offer the further advantages of remote control and interrogation.

According to analysis of current EMI threats, the disclosed detection system has a bandwidth of at least 30 MHz to 6 GHz. Accordingly the detector incorporates an antenna (or antenna(s)), a receiver with receiver protection and associated control electronics. Suitably all potentially EMI susceptible parts of the detector are housed in a shielded enclosure.

It may be beneficial for the antenna area to be scalable to accommodate new threats outside of existing bandwidths. To achieve the ultra-wideband response required of the antenna, one preferred solution is a spiral, such as a broad band inverted spiral or a centre-fed inverse log spiral.

So that the antenna has a wide as possible 'viewing' angle, the antenna can be printed on a flexible printed circuit board. This board can suitably be shaped to enhance or optimize the detection angle or beamwidth, for example curved (in azimuth or elevation) or hemispherical shape. The antenna conductive element can be made from a copper alloy, though other suitable metals can be used for example silver and gold. In some preferred embodiments, the antenna design has a large conductor area, such that it provides screening or partial screening to the device electronics, which is physically located behind the antenna.

The detector functionality allows discrimination of average: continuous wave (CW), characteristic of narrowband EMI and peak (or pulse) EMI, characteristic of wideband and ultra-wideband EMI. The detector incorporates a way of reducing false alarms by comparing the EMI signal voltage with a pre-set threshold voltage. This is achieved, for example using an algorithm which is derived from a threat and effects database and sets the threshold via three mechanisms;

a) defining a value of a fixed hardware attenuator used between the antenna and the receiver;
b) defining a value for a software controlled potentiometer used to fine tune the threshold, said threshold setting programmed into the unit via input of a coded level, said coded level is stored in volatile memory such that once power to the detector is lost and the battery back-up exhausted the software coded threshold is re-set;
c) defining the pulse response time of the peak detector.

The detector and/or the central terminal indicate that EMI events have been detected. For the detector units, the indicator can include visual indications via light emitting diodes. Other suitable visual indicators can be used. Audible indicators can be used e.g., a buzzer. Alternatively, the central terminal incorporates a software program which responds to the output signal from the detector devices communicated to the computer system via wired or wireless transmission, and provides indication of EMI events through software via a Graphical User Interface (GUI).

A non-volatile memory store is used for the storage of 'EMI event' and detector system status data. An 'EMI event' corresponds to a detection of single, narrowband or wideband EMI occurrences over a pre-determined threshold level. The event data is time stamped so that the EMI event(s) can be subsequently time correlated with faults experienced with co-located electrical equipment. Accurate timing is achieved by deriving a clock signal from an on-board Real Time Clock circuit, which is calibrated via an externally derived GPS/GNSS timing signal. The storage of event data provides the ability to allow a diagnostic/forensic approach to characterize and distinguish relevant EMI threats.

The detector also has the ability to provide detailed real-time surveys over a selectable period and interval, as well as storing a record of survey events or events above the pre-set threshold level on a non-volatile memory device. Comparing survey data with EMI event data also facilitates the reduction or minimizing of false alarms.

In a further aspect, some embodiments provide a method of providing power-down protection of electrical/electronic equipment from EMI through connection/control via the central terminal. Some embodiments also offer other benefits, such as low cost of production and running costs.

Particular advantages of the invention will be understood from the further description and examples as follows. Embodiments of the present invention will now be described by way of example only and with reference to the accompanying drawings, in which:

BRIEF DESCRIPTION OF THE DRAWINGS

FIG. 3 is a schematic of a device with an inverted log spiral antenna curved in Azimuth (the dark colour is the conductive surface and the light colour is the dielectric surface).

DETAILED DESCRIPTION

Figure 1:
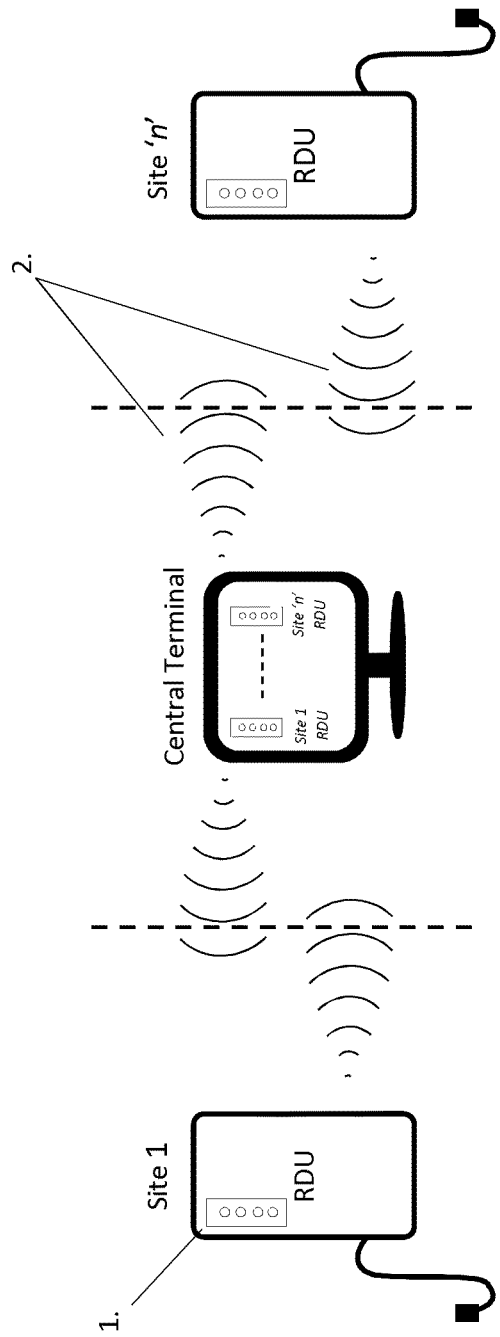
FIG. 1 is a schematic of an EMI detection and indicator system that includes remote detector units (RDU) wirelessly connected to a central terminal, which can be located offsite from the detector units.

In FIG. 1, any number of remote detection units can be connected to the terminal. The RDU provide visual indicators (1) of EMI events and system status. The central terminal also provides visual indicators through software via a graphic user interface (GUI).

As shown in FIG. 1, the Central terminal provides two way command, control and data recovery functions. It can be located offsite (away from the location of the remote detection units) and communicates with one or more remote detector units (RDU) (1) via a detachable wired data link or wireless data link in two formats; ZigBee for short range (less than 200 m) or GPRS SMS text messaging for longer range (Worldwide). The RDU provide visual indications of EMI events and system status. The Central Terminal can be a standard off the shelf computer system with a ZigBee and GPRS modem and loaded with bespoke software to provide command, control and data recovery functions. The central terminal also provides visual indications of EMI events. Two way wireless communications between the Central Terminal and 'n' RDU's, providing RDU programming uplink or EMI event or system status downlink from RDU's. Two way wireless communications modes (2) are possible (GPRS and ZigBee). A wired (USB) link is also provided for engineering purposes.

Figure 2:
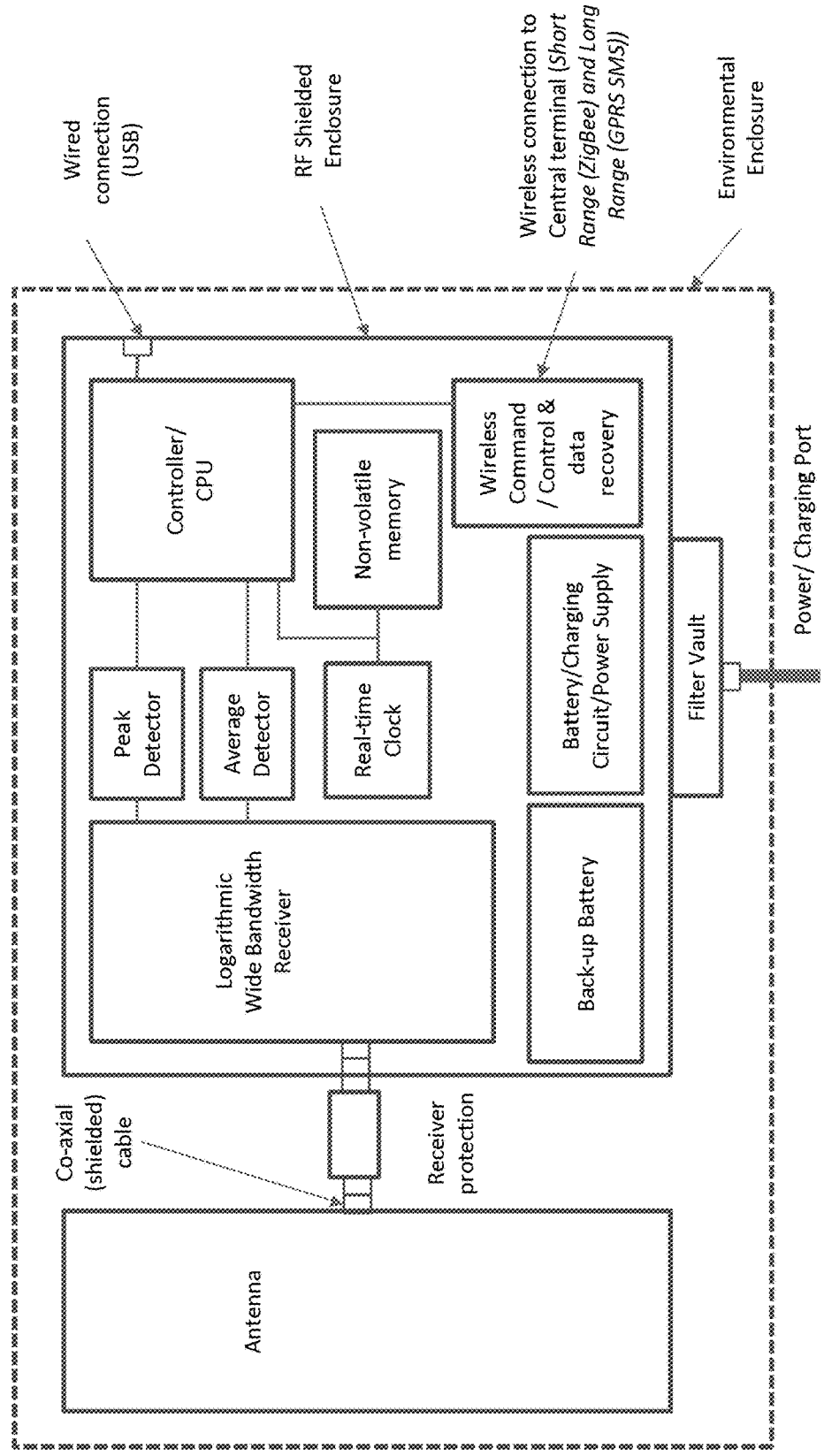
FIG. 2 is a schematic of a remote detection unit indicating key sub system functions discussed herein.

As shown in FIG. 2, the detector incorporates an antenna, or antenna(s) operating in receive mode to transduce radiated EMI into a voltage suitable for processing by a receiver. The antenna receiver combination provides an approximately flat voltage output over the frequency range 30 MHz to 6 GHz. The antenna receiver combination responds to pulse widths as short as typically 100 picoseconds. The antenna can be low cost—manufactured from readily available flexible, conformable, printed circuit board (PCB) material. The design can be etched onto the substrate using standard printed circuit board fabrication techniques. It can be installed in an arc to increase the viewing angle/beam width of the antenna and can be formed into other shapes such as a hemisphere.

As shown in FIG. 3, one exemplary antenna design is an inverted log-spiral, which provides a large conductive/metallic surface area such that the antenna provides a degree of screening for items located behind the antenna. The design of the antenna according to some embodiments can be visually pleasing.

The antenna can be scalable in two dimensions (area) to enable specific threat frequencies to be covered if for example any new threats emerge in the future which are outside of the present bandwidth of the antenna.

Receiver protection, as shown in FIG. 2, provides protection for the receiver front end within the defined limits prior to commissioning the detector unit for use. Receiver protection utilizes in series EMI attenuation and adjustable attenuation control. The magnitude of attenuation used is dependent on that required to bring the dynamic range of the receiver within that required by the detection algorithm. The first element of the receiver protection chain is sacrificial, meaning that, in the event of very high intensity EMI impinging on the detector device, the first element of the attenuation will fail first and create an open circuit condition.

The receiver responds to EMI signals (after propagation through the antenna and protection element) and converts the EMI signal to an output signal level that is related to the magnitude of the signal level on a logarithmic basis. Thus a small change in the input signal level creates a large change in the output signal level. The dynamic range of the receiver is at least 50 dB. The receiver interfaces to the peak detection/average detection element.

An RF threshold detector circuit includes two channels. One channel provides detection of the instantaneous 'average' EMI environment (characteristic of continuous wave (CW) or narrowband EMI); the other provides peak detection of EMI (characteristic of wideband and ultra-wideband EMI) with a pulse width response of typically 100 picoseconds.

The Peak/Average Detection, Set Threshold, element detects the EMI signals, enables the setting of threshold levels; peak/average RF levels, and waveform duration. There are a wide variety of potential EMI threat signals. In order to keep track of threat EMI signals a database describing key threat signal parameters (modulation, and output magnitude) can be built and used. This 'threat' database can be usefully assembled using data from a variety of sources.

In addition to the 'threat database,' an 'effects database' can be produced based on data from a variety of sources. Algorithms are produced from analysis of both the 'threat' database and the 'effects' database to calibrate the Peak/Average Detection threshold of the detector. Both the threat and effects database can be regularly updated with new threat or effects data. The algorithm is suitably implemented into the detector using three mechanisms; a) a fixed hardware attenuator is used between the antenna and the receiver. The value of the attenuator is defined by the algorithm; b) a software controlled potentiometer is used to fine tune the threshold. The software threshold setting is programmed into the unit via input of a coded level. The coded level is stored in volatile memory such that once power to the detector is lost (and the battery back-up is exhausted) the software coded threshold is reset, and c) The response time of the peak detector is calibrated against the response time indicated by the algorithm. The Peak/Average Detection interfaces to the EMI Detector controller or central processing unit (CPU).

The CPU controls the functioning of the EMI Detector system to ensure EMI events are captured; peak/average RF amplitude levels and event durations are measured and stored in both the CPU memory and the event store. The CPU interfaces to: the Non-volatile memory store; peak/average detectors; a wired programming port; and wireless network interface port(s). The CPU embedded software enables the CPU to perform the control functions, assignment of event data to the non-volatile event data storage device, and to monitor system status.

The EMI event data (magnitude of EMI above the threshold level, time of event, and data of event) is stored securely in a non-volatile memory, which is intended for use as potential evidence of event data of a standard suitable for use in legal proceedings.

The CPU is able to manage the storage of peak or average events simultaneously or separately at a selectable threshold level. The threshold level and the operation mode of the detector (peak, average or both) is programmable via a wired or wireless interface. The event data is time stamped using a real time clock and stored in memory and to a non-volatile memory device. The memory device is physically protected within a shielded enclosure to facilitate an anti-tamper design enabling the flash memory to be used for evidential purposes.

In some cases, it is anticipated that detectors may be required to be located in an environment where EMI events are commonly or routinely experienced. For example, locations where EMI events, such as those generated by arcs, corona, partial discharge and circuit breaker transients, are very common, particularly for example High Voltage Substation sites. In order to deal with and discriminate these common, routine or 'ambient' EMI events from significant EMI events, the detector can be equipped with an ambient survey mode, allowing full characterization of the ambient environment over a user determined survey period. Further, it may be useful to correlate 'events' recorded by the detector with an actual functional disturbance of the site critical electrical/electronic equipment.

A Tamper Detection Device enables the EMI detector system to alert the user that it has been tampered with by unauthorized persons, i.e., an unauthorized attempt to gain access to the EMI detector and to determine whether the detector has been moved from its installed location. The tamper detection device can be based on a GPS/GNSS location signal. The Power source for the detector primarily includes a Mains Power/Charger Module, which provides the primary power source. An internal Back-up Power Source (providing an internal back-up function) is also provided to maintain the operation of the EMI detection device during a mains power outage. The detection device is fitted within an EMI shielded and filtered enclosure to protect the detection electronics. The EMI shielded enclosure provides visual indication of the detector device 'status (on/off)', 'events detected', 'survey mode active', 'and GPRS active'. The shielded enclosure is in turn fitted within a plastic enclosure to provide an environmental barrier and to provide an appropriate method of fixing and mounting.

According to some embodiments, choices on the physical location of the detector(s) on the relevant site can be accommodated, including whether to include external power sources. Given the uncertainty of the magnitude of factors influencing the propagation of any threat from outside of the facility to inside, the setting of appropriate threshold to reflect a disturbance observed by the detector outside of the facility as an EMI 'threat' event can be challenging. One preferred strategy for the enhanced or optimum siting of detectors is to locate them as close to the critical equipment as possible, and in some cases preferably aligned to the most likely direction that the threat could emanate from.

Additionally, positioning the detector away from electrically noisy electrical/electronic equipment may be beneficial to allow better sensitivity and therefore a greater chance of detecting EMI.

The invention claimed is:

1. An electromagnetic interference (EMI) indicator, comprising:
   an ultra-wideband detector having a bandwidth of at least 30 MHz to 6 GHz, and including: at least one antenna for receiving an EMI signal, each antenna having receiver protection, a logarithmic receiver to convert the EMI signal into a direct voltage proportional to a magnitude of the EMI signal, a peak/average detector, and a controller connected to an output of the receiver for generating a signal when a direct voltage developed in the peak/average detector exceeds a pre-set threshold voltage using a defined algorithm;
   an indicator that connected to the controller so as to be activatable by the controller; and
   a non-volatile memory store, the controller storing EMI event data in the non-volatile memory store.

2. The EMI indicator according to claim 1, wherein the antenna has a large conductive area to provide screening, and is printed on a flexible printed circuit board.

3. The EMI indicator according to claim 1, wherein the antenna defines a broad band inverted spiral.

4. The EMI indicator according to claim 1, wherein the antenna is shaped so as to provide an increased detection angle, and is formed into one of a curved shape and a hemispherical shape in azimuth or elevation.

5. The EMI indicator according to claim 1, wherein the antenna is scalable in two dimensions to enable detection of specific threat frequencies or emerging new threats outside of the present bandwidth of the antenna.

6. The EMI indicator according to claim 1, further including attenuators configured to protect the receiver, the magnitude of an attenuation being a component part of a detection threshold algorithm.

7. The EMI indicator according to claim 1, wherein at least one of the peak/average detector and the controller includes a software programmed variable potentiometer for controlling the pre-set reference voltage (threshold) derived from databases.

8. The EMI indicator according to claim 1, wherein the controller is a central processing unit (CPU) and the indicator includes at least one of a visual indicator and an audible indicator.

9. The EMI indicator according to claim 1, wherein the indicator further includes one or more output ports for transmitting/receiving data from a computer system, that includes the indicator having a software program which responds to the output signal from the detector devices communicated to the computer system via wired or wireless transmission.

10. The EMI indicator according to claim 1, wherein an externally derived GPS/GNSS timing signal is used to aid tamper detection by providing an indication through change of co-ordinates as to whether the detector has been moved from its defined and installed location.

11. The EMI indicator according to claim 1, further including a battery backup for enabling EMI detection and EMI event data storage through power outages.

12. The EMI indicator according to claim 1, further including an EMI shielded enclosure and one or more electronics components housed within the EMI shielded enclosure.

13. The EMI indicator according to claim 1, wherein the receiver has an element with a sacrificial failure mode for providing an open circuit so as to protect the receiver.

14. The EMI indicator according to claim 1, further comprising a software program which responds to the output signal from the detector devices communicated to a computer system via wired or wireless transmission.

15. A computer system, comprising:
   the EMI indicator according to claim 1, the EMI indicator being incorporated into the computer system so as to provide remote control and interrogation; and
   a software application dedicated to interfacing the indicator.

16. The EMI indicator according to claim 1, wherein Peak/Average discrimination is achieved, enabling the discrimination of EMI signals with high peak power (characteristic of ultra-wideband waveforms) and EMI signals of high instantaneous average power content (characteristic of narrowband and CW waveforms).

17. The EMI indicator according to claim 1, wherein a non-volatile memory for enabling EMI events recorded by the detector to be time correlated with other events, including upset/malfunction of electrical/electronic systems, the non-volatile memory store being tamper protected enabling the data to be forensically examined and used for evidence.

18. The EMI indicator according to claim 1, further including an on board real time clock chip that provides a time stamp and that is calibrated against an externally derived GPS/GNSS timing signal, said time stamp thus forming an integral part of the event data string, stored in non-volatile memory.

19. The EMI indicator according to claim 1, wherein communication is achieved via one disconnectable wired channel/port and two forms of wireless channel GPRS for long range (Worldwide) and Zigbee for short range (less than 200 m).

20. A method of identifying EMI for electrical/electronic equipment, the method comprising:
   a) generating a direct current and voltage signal at an ultra-wideband detector having a bandwidth of at least 30 MHz to 6 GHz in response to electromagnetic radiation, the ultra-wideband detector including: at least one antenna for receiving an EMI signal, each antenna having receiver protection, a logarithmic receiver to convert the EMI signal into a direct voltage proportional to a magnitude of the EMI signal, a peak/average detector, and a controller connected to an output of the receiver;

b) comparing the direct voltage generated at step (a) with a pre-set reference voltage; and c) if the direct voltage exceeds the reference voltage, providing, by means of a controller that operates via a defined algorithm, an indication that the EMI signal is adverse.

21. The method according to claim 20, wherein a low false alarm rate can be achieved through selection of appropriate threshold levels derived from an algorithm, which in turn is derived from at least one of threat and effects databases and by suitable selection of a location of the detector within a detection area, by selecting locations for the detector, where EMI presents a threat to electrical/electronic equipment located within the detection area.

22. The method according to claim 20, wherein a low false alarm rate can be achieved through a survey mode enabling recording and monitoring of an ambient or usual EMI environment, and therefore providing the ability for the detector to discriminate usual/normal EMI from unusual EMI.

* * * * *